United States Patent [19]
Manley

[11] Patent Number: 5,410,266
[45] Date of Patent: Apr. 25, 1995

[54] CIRCUIT FOR CONVERSION OF SHIFTED DIFFERENTIAL ECL VOLTAGE LEVELS TO CMOS VOLTAGE LEVELS WITH PROCESS COMPENSATION

[75] Inventor: Robert B. Manley, Ft. Collins, Colo.

[73] Assignee: Hewlett-Packard Company, Palo Alto, Calif.

[21] Appl. No.: 138,656

[22] Filed: Oct. 18, 1993

[51] Int. Cl.$^6$ .................................... H03K 19/0175
[52] U.S. Cl. .................................. 326/73; 326/121
[58] Field of Search ............... 307/475, 448, 451, 443

[56] References Cited

U.S. PATENT DOCUMENTS

| | | | |
|---|---|---|---|
| 4,471,242 | 9/1984 | Noufer | 307/475 |
| 4,779,016 | 10/1988 | Sugiyama | 307/475 |
| 4,835,419 | 5/1989 | Chappell | 307/475 |
| 4,841,175 | 6/1989 | De Man | 307/475 |
| 4,996,443 | 2/1991 | Tateno | 307/451 |

Primary Examiner—Edward P. Westin
Assistant Examiner—Andrew Sanders

[57] ABSTRACT

A CMOS circuit for converting voltage levels between shifted differential ECL voltage level input signals and a CMOS voltage level signal. The ECL levels are referenced to the VDD voltage of the CMOS circuit and can be connected to ECL circuits that are connected between the CMOS VDD voltage and ground. The circuit has a pFET connected between a supply voltage and the output signal, and an nFET connected between the output signal and circuit ground. An inverted signal of the differential shifted ECL voltage input signals is connected to a gate of the nFET. A level shifting circuit connects the input signals to a gate of the pFET to ensure that it correctly drives the output signal when the input signals change logic levels.

5 Claims, 1 Drawing Sheet

CIRCUIT FOR CONVERSION OF SHIFTED DIFFERENTIAL ECL VOLTAGE LEVELS TO CMOS VOLTAGE LEVELS WITH PROCESS COMPENSATION

FIELD OF THE INVENTION

This invention relates to electronic circuits and more particularly to electronic circuits within a Complementary Metal Oxide Semiconductor (CMOS) Integrated Circuit. Even more particularly, the invention relates to a circuit for converting between Shifted Differential Emitter Coupled Logic and CMOS circuit voltage levels that includes compensation for manufacturing process variations.

BACKGROUND OF THE INVENTION

CMOS integrated circuits are a logic family that is widely used in designing electronic circuits because it uses very little power. Emitter Coupled Logic (ECL) circuits use much more power, however, ECL is much faster than CMOS and is used when CMOS is not fast enough for the circuit. The reduced voltage swing of ECL causes less radiation of signals connected through a printed circuit board. Also, ECL is designed to drive transmission lines having low impedance, so it provides better signal characteristics between integrated circuits at high frequencies. For example, ECL is used when providing high frequency signals to generate video signals for very high resolution cathode ray tubes used in computer workstations.

CMOS integrated circuits typically use a 5 volt supply for operation, and the logic levels change over the entire range of this voltage, that is, 0 volts is output for a logic zero, and 5 volts is output for a logic one. ECL has traditionally used a $-5.2$ volt supply. The ECL circuits reference their logic levels from ground and output is over a much narrower range, having worst case values of $-1.1$ for a logic one, and $-1.5$ for a logic zero.

ECL circuits can be combined with CMOS circuits by also using the CMOS $+5$ volt supply voltage for the ECL, and having the ECL reference its signals to the $+5$ volt supply, rather than ground. When this is done, the ECL logic one will be 3.9 volts, and the ECL logic zero will be 3.5 volts. This method provides the speed benefits of ECL while allowing the circuits to be combined into a single integrated circuit. ECL used in this manner is sometimes called "pseudo" ECL, positive ECL or shifted ECL.

Because of the narrow range between worst case values for a logic one and a logic zero, variations in the CMOS fabrication process can seriously affect whether the ECL circuit will function correctly. If the process variation causes the CMOS transistors to be "fast" or "slow" although still within the CMOS fabrication process tolerance, the circuits that convert between CMOS levels and ECL levels may not provide sufficient margin to function properly.

There is a need in the art then for a conversion circuit that converts between shifted ECL and CMOS voltage levels, fabricated within a CMOS integrated circuit, that provides adequate output margins over all ranges of fabrication process variations. The present invention meets this and other needs.

SUMMARY OF THE INVENTION

It is an aspect of the present invention to provide a circuit to convert shifted differential ECL logic voltage levels to CMOS logic voltage levels.

It is another aspect of the circuit to maintain ECL logic level margins over a range of CMOS fabrication process variations.

The above and other aspects of the invention are accomplished in a CMOS circuit for converting voltage levels between shifted differential ECL voltage level input signals and a CMOS voltage level signal. The ECL levels are referenced to the VDD voltage of the CMOS circuit and can be connected to ECL circuits that are connected between the CMOS VDD voltage and ground.

The circuit has a pFET connected between a supply voltage and the output signal, and a first nFET connected between the output signal and circuit ground. An inverted signal of the differential shifted ECL voltage input signals is connected to a gate of the first nFET. The inverted signal is also connected to the gate of a second nFET, which is connected between the supply voltage and a gate of the pFET. A third nFET is connected between the gate of the pFET and circuit ground, and the second and third nFETs form a voltage level shifting circuit to supply a shifted signal to the gate of the pFET.

Fourth and fifth nFETs are connected in series between the supply voltage and circuit ground. The fourth nFET is connected to the supply voltage, and a non-inverted input signal of the differential shifted ECL voltage input signals is connected to the gate of the fourth nFET. The fifth nFET has a gate connected to the shifted signal, and a gate of the third nFET is connected between the fourth and fifth nFETs. The third and fifth nFETs form a regenerative circuit that accelerates the transition from one logic level to another.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

Figure 1:
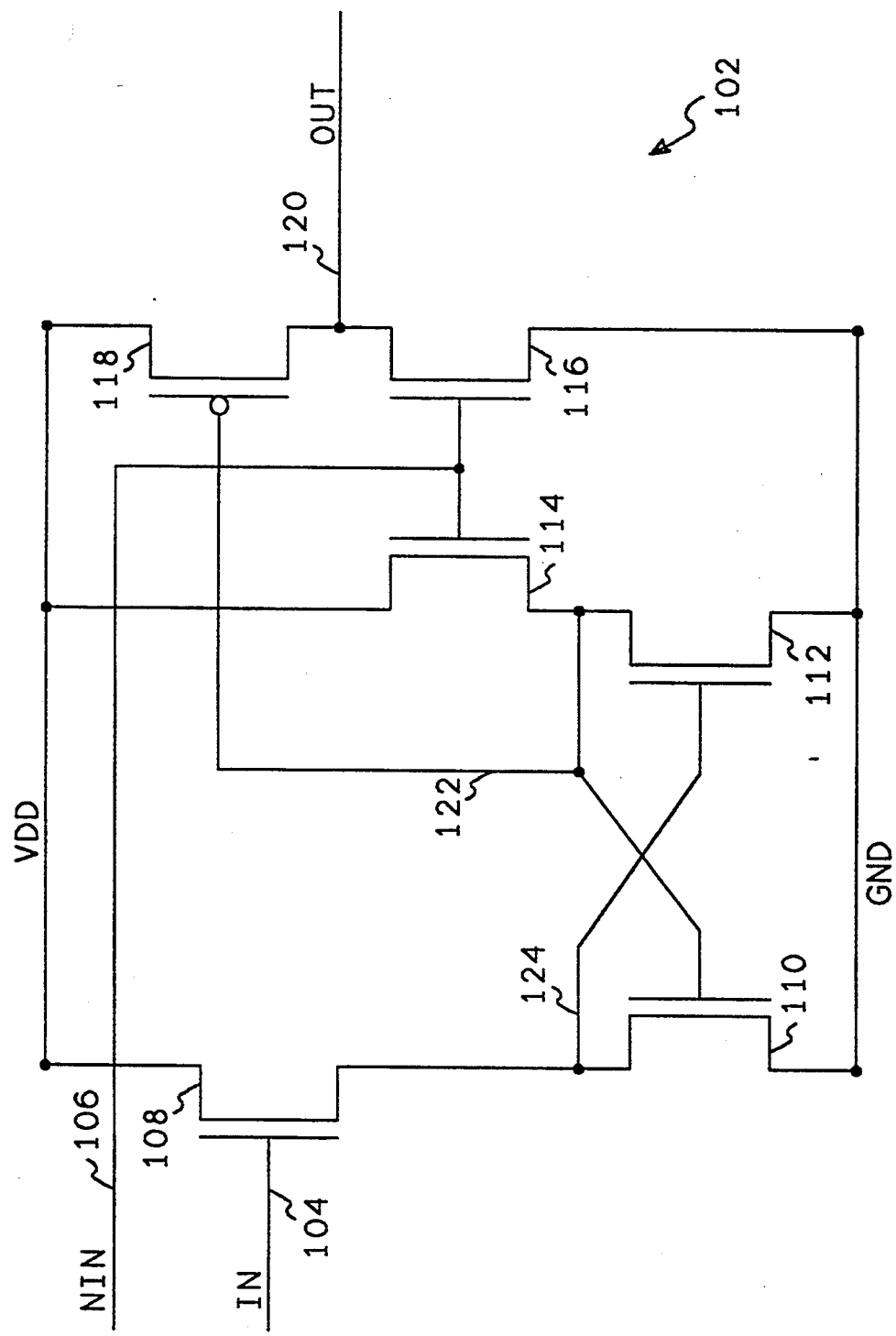
FIG. 1 shows a schematic diagram of the shifted differential ECL to CMOS conversion circuit of the invention.

The following description is of the best presently contemplated mode of carrying out the present invention. This description is not to be taken in a limiting sense but is made merely for the purpose of describing the general principles of the invention. The scope of the invention should be determined by referencing the appended claims.

FIG. 1 shows a shifted differential ECL to CMOS voltage level conversion circuit. Referring now to FIG. 1, circuit 102 has an input signal 104 and an inverted input signal 106. pFET 118 and nFET 116 form a CMOS inverter, with the inverted input 106 connected directly to the gate of nFET 116, and with a level shifted inverted input signal connected to the gate of pFET 118.

Inverted input 106 also connects to the gate of nFET 114 which is connected between VDD and nFET 112.

nFET 112 provides a load for nFET 114, and the combination of nFET 114 and nFET 112 provides a level shifting function to shift inverted input signal 106 downward to provide shifted signal 122, which connects to the gate input to pFET 118. Because the low logic voltage level for ECL is within the gate to source threshold range of the pFET 118, the input signal is shifted down about one volt, by nFETs 112 and 114, before being connected to the gate of pFET 118.

nFETs 108 and 110 are connected as a level shifter for the IN signal 104. The cross coupling of nFETs 110 and 112 provide stabilization to the level shifting function, and work to increase transition speed as the input changes logic levels.

In operation, when NIN signal 106 drops, nFET 114 conducts less causing signal 122 to drop. At the same time IN 104 rises causing nFET 108 to increase conduction which causes signal 124 to rise causing nFET 112 to increase conduction which pulls shifted signal 122 down faster. Signal 122 droping causes nFET 110 to decrease conduction which causes signal 124 to rise faster, thus a regenerative feedback occurs between nFETs 110 and 112 to accelerate the transition, and cause pFET 118 to increase conduction faster. When NIN 106 rises, the opposite effect occurs, thus pFETs 108, 110, 112, and 114 improve the speed of the circuit.

The size ratios of the FETs can be adjusted to optimize performance of the circuit. nFETs 108 and 114 would be the same size, as would nFETs 110 and 112. A ratio between the 108/114 size and the 110/112 size of 1.14 to 1 provides a faster circuit with less margin. A ratio between the 108/114 size and the 110/112 size of 1 to 1.1 provides more margin, but is slower. The ratios of pFET 118 to nFET 116 are adjusted to correspond to the above ratios, wherein for the 1.14 to 1 ratio, the ratio of pFET 118 to nFET 116 is 3 to 1. For the ratio of 1 to 1.1, the ratio of pFET 118 to nFET 116 is 3.5 to 1.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A converter circuit for converting differential shifted ECL voltage level input signals to a CMOS voltage level output signal within a CMOS integrated circuit, said converter circuit comprising:
    a pFET connected between a supply voltage and said output signal;
    a first nFET connected between said output signal and a circuit ground, said nFET having an inverted signal of said differential shifted ECL voltage level input signals connected to a gate thereof; and
    a voltage level shifting circuit connected to said differential shifted ECL voltage level input signals and further connected to a gate of said pFET, wherein said voltage level shifting circuit shifts said inverted signal at least one volt toward ground level to provide a shifted signal to said gate of said pFET.

2. The converter circuit of claim 1 wherein said voltage level shifting circuit comprises:
    a second nFET connected between said supply voltage and said gate of said pFET, said second nFET having said inverted signal connected to a gate thereof;
    a third nFET connected between said gate of said pFET and said circuit ground; and
    fourth and fifth nFETs connected in series between said supply voltage and said circuit ground, said fourth nFET being connected to said supply voltage, and said fourth nFET having a non-inverted input signal of said differential shifted ECL voltage input signals connected to a gate thereof, said fifth nFET having a gate connected to said gate of said pFET, and said third nFET having a gate connected between said fourth and fifth nFETs.

3. A converter circuit for converting differential shifted ECL voltage level input signals to a CMOS voltage level output signal within a CMOS integrated circuit, said converter circuit comprising:
    a pFET connected between a supply voltage and said output signal;
    a first nFET connected between said output signal and a circuit ground, said nFET having an inverted signal of said differential shifted ECL voltage input signals connected to a gate thereof;
    a second nFET connected between said supply voltage and a gate of said pFET, said second nFET having said inverted signal of said differential shifted ECL voltage input signals connected to a gate thereof;
    a third nFET connected between said gate of said pFET and said circuit ground, wherein said second and third nFETs form a voltage level shifting circuit; and
    fourth and fifth nFETs connected in series between said supply voltage and said circuit ground, said fourth nFET being connected to said supply voltage, and said fourth nFET having a non-inverted input signal of said differential shifted ECL voltage input signals connected to a gate thereof, said fifth nFET having a gate connected to said gate of said pFET, and said third nFET having a gate connected between said fourth and fifth nFETs.

4. The circuit of claim 3 wherein said second and said fourth nFETs are substantially the same size, said third and said fifth nFETs are substantially the same size, and wherein a size of said second and said fourth nFETs is a predetermined ratio to a size of said third and said fifth nFETs.

5. The circuit of claim 2 wherein said second and said fourth nFETs are substantially the same size, said third and said fifth nFETs are substantially the same size, and wherein a size of said second and said fourth nFETs is a predetermined ratio to a size of said third and said fifth nFETs.

* * * * *